United States Patent [19]

Oh

[11] Patent Number: 5,235,425
[45] Date of Patent: Aug. 10, 1993

[54] AUTOMATIC TUNING METHOD AND DEVICE THEREOF

[75] Inventor: Byung S. Oh, Kyungki, Rep. of Korea

[73] Assignee: Samsung Electronics Co., Ltd., Rep. of Korea

[21] Appl. No.: 913,043

[22] Filed: Jul. 14, 1992

[30] Foreign Application Priority Data

Jul. 15, 1991 [KR] Rep. of Korea .................... 91-12329

[51] Int. Cl.[5] ............................................. H04W 5/445
[52] U.S. Cl. ................................ 358/191.1; 358/147
[58] Field of Search .................... 358/142, 147, 191.1, 358/188; 455/3.2; 371/62

[56] References Cited

U.S. PATENT DOCUMENTS

| | | | |
|---|---|---|---|
| 4,340,900 | 6/1983 | Van Kampen et al. | 358/147 |
| 4,474,146 | 10/1984 | Cohn | 357/147 |
| 4,977,455 | 12/1990 | Young | 358/147 |
| 5,051,829 | 9/1991 | Chang | 358/191.1 |
| 5,054,023 | 10/1991 | Kronberg | 371/62 |
| 5,130,803 | 7/1992 | Kurita et al. | 358/191.1 |

FOREIGN PATENT DOCUMENTS 0068287 3/1991 Japan .

*Primary Examiner*—James J. Groody
*Assistant Examiner*—Jeffrey J. Murrell
*Attorney, Agent, or Firm*—Sughrue, Mion, Zinn, Macpeak & Seas

[57] ABSTRACT

An automatic tuning system for automatically compensating for a tuning error of a TV receiver to maintain a satisfactory receiving state which detects whether an error in a video program system signal is generated due to an abnormal receiving state, changes the frequency of the oscillating signal, which is mixed with the received broadcasting signal, by varying tuning data if an error is detected, thereby automatically performing the tuning operation so as to maintain the satisfactory receiving state of the RF broadcasting signal.

8 Claims, 2 Drawing Sheets

AUTOMATIC TUNING METHOD AND DEVICE THEREOF

BACKGROUND OF THE INVENTION

The present invention relates to automatic tuning method and device for receiving a television broadcasting signal, and more particularly relates to an automatic tuning method and device for automatically compensating a tuning error of a TV receiver to maintain a satisfactory receiving state.

Generally, when a video tape recorder (VTR) records the received TV broadcasting signal, the recording operation of the VTR is controlled according to a video program system (VPS) signal superimposed on the TV broadcasting signal. The VPS signal exists in the 16th scanning line (16H) among the vertical retrace line interval (20H). Such a VPS signal includes several kinds of data relating to broadcasting program, that is, broadcasting station data, program distinguishing data, time data and so on. VTR performs the recording operation by comparing the data involved in the VPS signal with the data set by a user. For example, a reserved recording function of the VTR is performed by comparing data for a broadcasting station, program and time involved in the received VPS signal with data for a broadcasting station, program and time set by a user.

Moreover, when an error in a VPS signal is generated due to the dissatisfactory receiving state when the VTR records the presently broadcasting TV signal at the same time of receiving thereof, users compensate the error by tuning manually, thereby keeping the satisfactory receiving state.

Therefore, if an error is generated due to the dissatisfactory receiving state in the case of the reserved recording set forth above or in the case that a user is absent, the VTR can not record the TV signal because of the error.

The VPS signal level is related to a teletext (TTX) signal level existing in the vertical retrace line interval (20H). Therefore, if an error in the VPS signal is generated due to the dissatisfactory receiving state, an error is generated to the TTX signal, thereby causing the TTX signal to be abnormally displayed. In this case, the error is compensated for by manually tuning.

Thus, the conventional tuning devices are disadvantageous in that users have to compensate for an error in a VPS signal or a TTX signal by manually tuning when the receiving state of a TV broadcasting signal is dissatisfactory. Furthermore, there is a drawback in that the recording is impossible or a TTX signal is abnormally displayed in the case that the error can not be compensated due to the absence of the user.

SUMMARY OF THE INVENTION

Accordingly, it is an object of the present invention to provide an automatic tuning method for automatically compensating for an error which occurs to the TV broadcasting signal when received under the dissatisfactory receiving state, thereby keeping the satisfactory receiving state.

Another object of the present invention is to provide an automatic tuning device for realizing the above mentioned method.

To achieve the above mentioned objects, an automatic tuning method is provided for outputting a composite video signal by mixing a broadcasting signal having superimposed thereon a video program system signal with an oscillating signal having a predetermined frequency, the method comprises a step for discriminating as to whether or not the VPS signal is normal; a step for generating one pulse signal at each predetermined period during which the VPS signal is normal; a step for counting said pulse signal; and a step for changing said frequency of the oscillating signal under the absence of said pulse signal at each period.

An automatic tuning device is also provided which includes an oscillator for generating an oscillating signal of a predetermined frequency for outputting a composite video signal by mixing a broadcasting signal having superimposed thereon a video program system signal with the oscillating signal, the device further includes a VPS signal detecting unit for discriminating as to whether or not the VPS signal superimposed on the composite video signal is normal and for generating one pulse signal at each predetermined period during which the VPS signal is normal; means for detecting and counting the pulse signal provided from the VPS signal detecting unit at each predetermined period; and means for changing the frequency of said oscillating signal at each predetermined period under the condition that said detecting and counting means detect no pulse signal.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Figure 1:
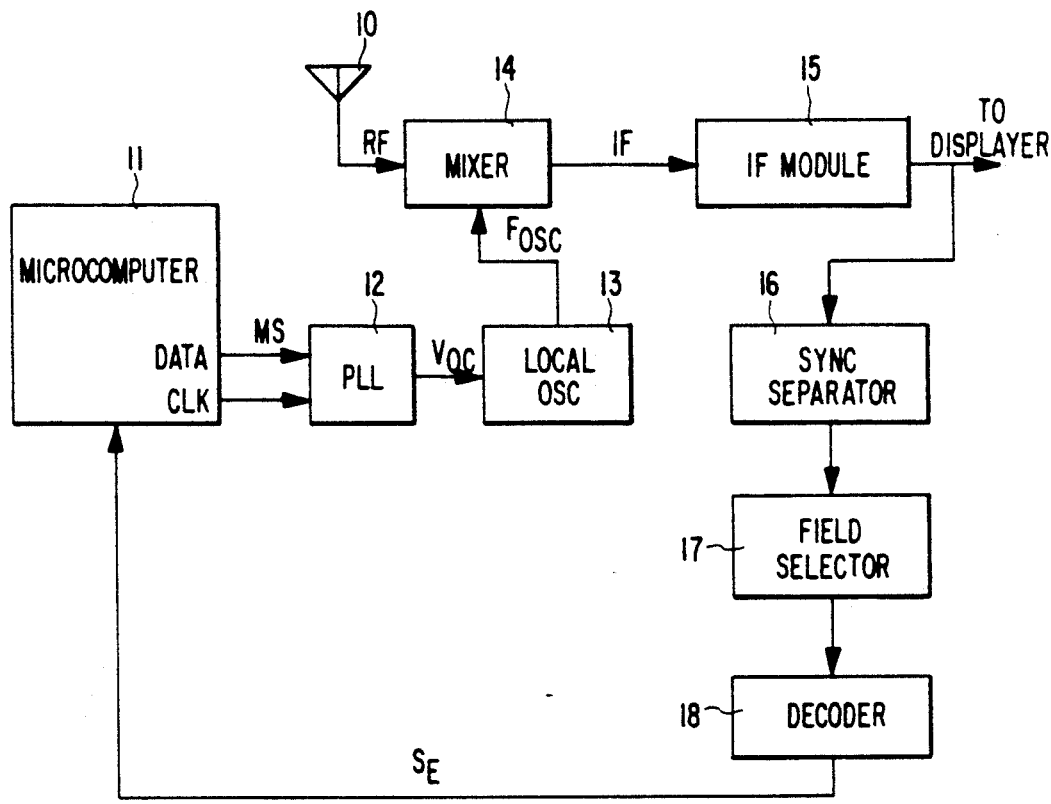
FIG. 1 is a block diagram showing the preferred embodiment of an automatic tuning device according to the present invention.

Referring to FIG. 1, an automatic tuning device according to the preferred embodiment of the present invention includes an antenna 10 for receiving a TV broadcasting signal, microcomputer 11 for generating tuning data M,S so as to receive a predetermined TV broadcasting signal, a phase locked loop (PLL) circuit 12 for generating a DC voltage signal Voc corresponding to the tuning data provided from microcomputer 11, local oscillator 13 for outputting an oscillating signal Fosc having a frequency which can be varied according to the difference of the voltage level of the DC voltage signal provided from the PLL circuit 12, mixer 14 for outputting an intermediate frequency (IF) signal by mixing a radio frequency (RF) broadcasting signal received through antenna 10 with the oscillating signal provided from local oscillator 13, an IF module 15 for converting an IF signal provided from mixer 14 into a composite video signal, synchronizing signal separator 16 for separating a vertical synchronizing signal from the composite video signal, a field selector 17 for selecting an odd field from the separated vertical synchronizing signal, and a decoder 18 for decoding the 16H of the selected odd field and providing an error discriminating signal SE in accordance with the decoding result to microcomputer 11.

Figure 2A:
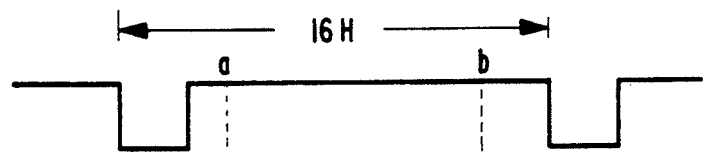
FIGS. 2A–2C are timing charts of input/output signals to some elements of FIG. 1.
Figure 2B:
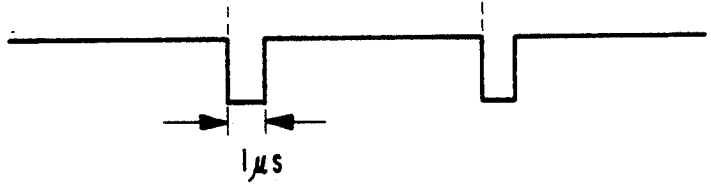
Figure 2C:
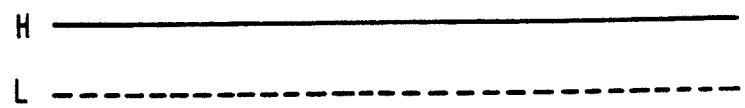

FIG. 2A shows the 16H among the vertical retrace line interval of a composite video signal. FIG. 2B shows an error discriminating signal to be generating under the condition that a VPS data superimposed on the 16H is normal. FIG. 2C shows an error discriminating signal to be generated under the condition that a VPS data superimposed on the 16H is abnormal. The operation of the device of FIG. 1 will now be described referring to FIGS. 2A to 2C. Microcomputer 11 provides tuning data M,S for tuning a desirable broadcasting signal and a clock signal to PLL circuit 12. The tuning data is read from a data storing unit (not shown) within the microcomputer PLL circuit 12 generates a DC voltage signal Voc corresponding to the tuning data and provides the generated DC voltage signal to local oscillator 13. The local oscillator generates and provides an oscillating signal having a frequency which is varied according to the difference between voltage levels of the DC voltage signal to mixer 14. The mixer 14 outputs an intermediate frequency signal IF by mixing a radio frequency (RF) broadcasting signal received through the antenna 10 with the oscillating signal provided from the local oscillator 13. That is, mixer 14 tunes a RF signal in response to tuning data input from microcomputer 11 and then converts the RF signal into the IF signal. The IF signal output from mixer 14 is inverted to a composite video signal at IF module 15 and is provided to a displayer (not shown) and a synchronizing signal separator 16, respectively. The synchronizing signal separator 16 separates the horizontal synchronizing signal and the vertical synchronizing signal from the composite video signal received from IF module 15. A field selector 17 selects the vertical synchronizing signal falling under an odd field from the separated synchronizing signals. That is, field selector 17 selects and outputs the scanning lines of the odd number forming the odd field among the separated synchronizing signal. Decoder 18 decodes the 16H among the synchronizing signal of the odd field provided from field selector 17, and then generates one of two different kinds of error discriminating signal SE according to whether or not there is an error in the VPS data existing on the 16H.

FIG. 2A shows the 16H to be decoded at decoder 18. In FIG. 2A, a is the beginning position of the VPS data and b is the ending position of the VPS data. FIGS. 2B and 2C show error discriminating signals to be generated as a result of decoding the 16H. FIG. 2B shows the error discriminating signal to be generated in the case where there is no error in the VPS data existing on the 16H, and FIG. 2C shows the signal to be generated in the case where there is an error in the VPS signal. In the case in which there is no error in the VPS signal, decoder 18 generates a pulse having a predetermined pulse width (1µS) both at the beginning position a and at the ending position b of the data, as shown in FIG. 2B. On the other hand, in the case where there is an error in the VPS signal, decoder 18 generates a signal having a constant level without any pulse as shown in FIG. 2C (e.g., a High (H) constant level in FIG. 2C). Such an error discriminating signal SE is provided from decoder 18 to microcomputer 11. In accordance with the error discriminating signal SE, microcomputer 11 recognizes whether or not there is an error in the VPS signal, by detecting the existence of the pulse of the error discriminating signal.

If there is no error in the VPS signal, that is, if there is a pulse in the error discriminating signal, microcomputer 11 counts the number of pulses inputted. If microcomputer 11 continuously counts a predetermined number of pulses, the microcomputer recognizes that the present receiving state is normal without any error in the VPS signal. Therefore, the microcomputer maintains the present tuning data being provided to PLL circuit 12 and also stores the tuning data into a data storing unit installed therein. On the other hand, if there is an error in the VPS signal, that is, if there is no pulse in the error discriminating signal, microcomputer 11 recognizes that the present receiving state is abnormal. Accordingly, the microcomputer changes the present tuning data and then provides the changed tuning data to PLL circuit 12. As a result of the changed tuning data, PLL circuit 12 changes the voltage level of the DC voltage signal and provides the changed DC voltage signal to local oscillator 13. The local oscillator changes the present frequency of the oscillating signal in response to the changed DC voltage signal. Therefore, mixer 14 outputs a new IF signal by mixing the RF signal received through antenna 10 with the changed frequency of the oscillating signal. In other words, mixer 14 converts a RF signal tuned with the changed tuning data provided by microcomputer 11 to an IF signal. The IF signal is then inverted to a composite video signal through IF module 15. This composite video signal is provided to an error discriminating circuit having synchronizing separator 16, field selector 17 and decoder 18. The error discriminating circuit separates the synchronizing signal from the composite video signal, as described above, and after selecting an odd field and decoding the 16H, outputs an error discriminating signal SE in accordance with the result. Then, microcomputer 11 detects any pulses of the error discriminating signal. As a result, if microcomputer 11 recognizes that there is an error in the VPS signal, the microcomputer again changes the tuning data, and then provides the changed tuning data to PLL circuit 12. An oscillating circuit having PLL circuit 12 and local oscillator 13 then generates the changed frequency of the oscillating signal in response to the changed tuning data. Then, mixer 14 outputs an IF signal representing the mixed received RF signal and the changed oscillating signal.

As can be seen from the above explanation, an error of the tuning data can be compensated by repeatedly performing such a correction procedure as described above. Thus, the automatic tuning device according to the preferred embodiment of FIG. 1 detects the existence of an error in the VPS data on the 16H of the vertical retrace line interval, and changes or maintains the tuning data in response to the detected result. That is, the device keeps the present tuning data in the case where no error is detected in the VPS data, and in the case where an error is detected in the in the VPS data, the device changes the present tuning data until the error is no longer detected. Therefore, the device of the present invention keeps a satisfactory receiving state of the broadcasting signal by automatically compensating for a tuning error.

Figure 3:
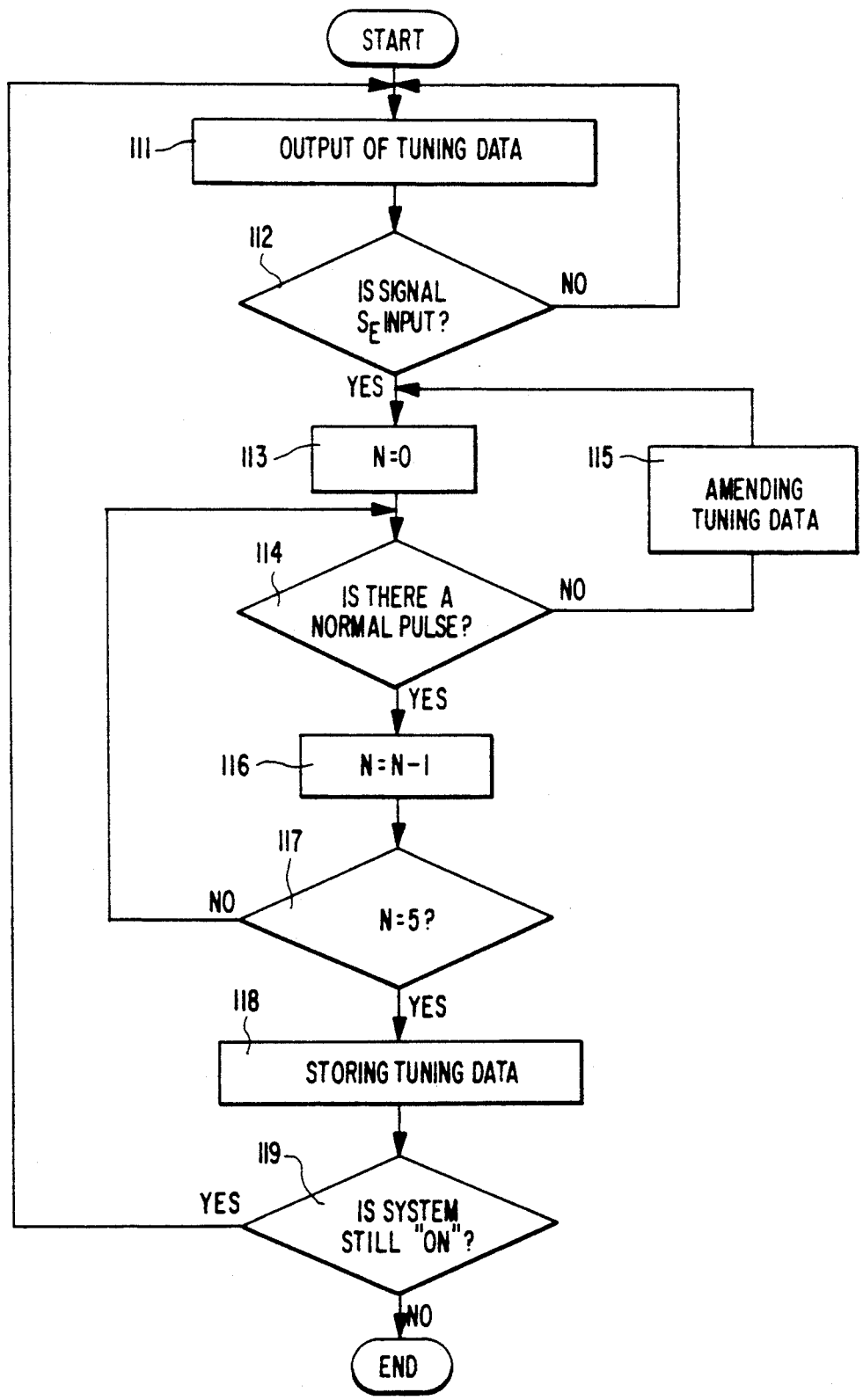
FIG. 3 is a flow chart illustrating the operation of a control unit of FIG. 1.

FIG. 3 is a flow chart illustrating the operation of the microcomputer of the automatic tuning device according to the present invention. As shown in FIG. 3, after the system is turned on, microcomputer 11 provides the tuning data stored in the data storing part to PLL circuit 12 (step 111). At step 112, the existence of an error discriminating signal, which is generated by decoding the 16H of the composite video signal, is inspected. If the error discriminating signal is not input, microcomputer goes back to step 111 and outputs the present tuning data. If the error discriminating signal is input, microcomputer Il sets a counter N so as to be equal to 0 and then goes to step 114. At step 114, it is detected as to whether or not there is a normal pulse in the error discriminating signal. If there is a normal pulse, microcomputer 11 adds 1 to the counter (i.e., N=N+1), and then continues to detect the following normal pulses in the error discriminating signal which will be generated by decoding the 16H of the next odd field in regular sequence. Whenever the pulse is normally detected, the counter is incremented by 1 (step 116). If the normal pulse is continuously detected up to 5 (step 117), the microcomputer recognizes that the receiving VPS signal is normal and therefore stores the present tuning data into the data storing part as well as outputting the tuning data continuously (step 118).

However, at step 114 if the normal pulse is not detected from the discriminating signal, that is, there is an error in the VPS data, the microcomputer changes the tuning data and outputs the changed tuning data (step 115). Specifically, the local oscillating frequency Fosc to be generated by the PLL 12 is provided by the equation:

$$Fosc = 50 \times (32M \times S) \text{ [Khz]};$$

where M is a main counting value (i.e., a variable used for changing the channel), and S is a swallow counting value (i.e., a variable used for adjusting a minute or fine tuning range). The constants 50 and 32 in the equation are values employed in the PAL system. Both of the variables M and S are binary data stored in the memory of the microcomputer 11.

When the microcomputer 11 receives a signal for changing the channel (e.g., from a remote controller), microcomputer 11 provides the appropriate main counting value M for the above-indicated equation. Accordingly, the PLL 12 provides a voltage Voc corresponding to the main counting value M to the local oscillator 13. The oscillator 13 then generates an oscillating signal Fosc having a frequency calculated according to the above-indicated equation.

If microcomputer 11 does not receive a pulse in the error discriminating signal Se, then microcomputer 11 increases or decreases the swallow counting value S (e.g., by incrementing or decrementing the swallow counting value by 1), and provides the increased or decreased value to the PLL 12. Accordingly, in this way the tuning range is minutely adjusted. After the tuning data is amended or changed (step 115), the counter is reset (step 113), and the next procedures are repeated until the normal pulse is continuously detected up to 5 times (steps 114, 116 and 117).

As described above, the device of the present invention decodes the 16H of the received composite video signal and changes the frequency of the oscillating signal by providing a variable tuning data according to the result of decoding the 16H to a PLL circuit, thereby automatically performing the tuning operation so as to maintain a satisfactory receiving state of the RF broadcasting signal. Accordingly, the device of the present invention can solve the problem in which users are required to compensate for an error of a VPS signal or a TTX signal by manually tuning the device when the receiving state of a TV broadcasting signal is not satisfactory, and further in that the recording is impossible or a TTX signal is abnormally displayed in the case that the error can not be compensated due to the absence of users.

What is claimed is:

1. An automatic tuning method for outputting a composite video signal by mixing a received broadcasting signal having a video program system (VPS) signal superimposed thereon with an oscillating signal having a predetermined frequency, the method comprising the steps of:
    determining whether said VPS signal is normal;
    generating a pulse signal at each predetermined period during which the VPS signal is normal;
    counting said generated pulse signals; and
    changing the predetermined frequency of the oscillating signal at each period a pulse signal is not counted.

2. An automatic tuning method as claimed in claim 1, further comprising storing a present frequency of the oscillating signal when a predetermined number of pulses is are successively detected.

3. An automatic tuning method as claimed in claim wherein said determining step includes separating a synchronizing signal from the composite video signal and selecting an odd field of the separated synchronizing signal.

4. An automatic tuning method as claimed in claim 3, wherein said step of generating a pulse signal includes decoding a 16H of the separated odd field synchronizing signal.

5. An automatic tuning device including an oscillator for generating an oscillating signal having a predetermined frequency, a device for outputting a composite video signal by mixing a received broadcasting signal having a video program system signal superimposed thereon with the oscillating signal, said device comprising:
    a VPS signal detecting unit for discriminating as to whether the VPS signal superimposed on the composite video signal is normal and for generating one pulse signal at each predetermined period during which the VPS signal is normal;
    a counter for detecting and counting the pulse signal provided from the VPS signal detecting unit at each predetermined period; and
    a frequency changing device for changing a frequency of said oscillating signal at each predetermined period when said counter fails to detect a pulse signal.

6. An automatic tuning device as claimed in claim 5, further comprising a storage device for storing a present frequency of the oscillating signal when said counter continuously counts a predetermined number of pulses.

7. An automatic tuning device as claimed in claim 5, wherein said VPS signal detecting unit includes a separator for separating a synchronizing signal from the composite video signal, a field selector for selecting an odd field of the synchronizing signal, and a decoder for decoding a 16H of the selected odd field synchronizing signal.

8. An automatic tuning device as claimed in claim 5, wherein said frequency changing device includes a PLL circuit for generating a DC voltage signal corresponding to inputted data and a local oscillator for generating an oscillating signal, a frequency of the generated oscillating signal being changed in response to the DC voltage signal provided from said PLL circuit.

* * * * *